United States Patent
Isobe

(10) Patent No.: US 6,417,047 B1
(45) Date of Patent: Jul. 9, 2002

(54) MANUFACTURING METHOD OF A NON-VOLATILE SEMICONDUCTOR MEMORY DEVICE HAVING ISOLATION REGIONS

(75) Inventor: Kazuaki Isobe, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/665,689

(22) Filed: Sep. 20, 2000

(30) Foreign Application Priority Data

Sep. 20, 1999 (JP) .......................................... 11-265205

(51) Int. Cl.[7] .............................................. H01L 21/336
(52) U.S. Cl. ..................................... 438/258; 438/296
(58) Field of Search ....................... 438/197, 257–267, 438/294, 296, 424, 435–438, 587, 588

(56) References Cited

U.S. PATENT DOCUMENTS 6,222,225 B1 * 4/2001 Nakamura .................. 257/315
6,235,589 B1 * 5/2001 Meguro ...................... 438/267
6,281,050 B1 * 8/2001 Sakagami ................... 438/142

OTHER PUBLICATIONS

Shimizu et al., "A Novel High–Density 5F$^2$ NAND STI Cell Technology Suitable for 256Mbit and 1Gbit Flash Memories", IEEE IEDM, Tech. Dig., pp. 271–274, (1997).
Watanabe et al., "Novel 0.44$\mu$m$^2$ Ti–Salicide STI Cell Technology for High–Density NOR Flash Memories and High Performance Embedded Application", IEEE IEDM, Tech. Dig., pp. 975–978, (1998).

* cited by examiner

Primary Examiner—Howard Weiss
Assistant Examiner—Marcos D. Pizarro-Crespo
(74) Attorney, Agent, or Firm—Finnegan, Henderson, Farabow, Garrett & Dunner, L.L.P.

(57) ABSTRACT

A cell array region and a peripheral transistor region are provided. In the cell array region, a plurality of memory cell transistors are formed, and element regions of the memory cell transistors are isolated by an embedded isolation region. In the peripheral transistor region, a plurality of peripheral circuit transistors are formed, and element regions of the peripheral circuit transistors are isolated by an embedded isolation region. Isolation end portions of the gate electrode of each peripheral circuit transistor do not fall in grooves of the embedded isolation region but is positioned to be horizontal to the center part of the gate electrode.

10 Claims, 10 Drawing Sheets

MANUFACTURING METHOD OF A NON-VOLATILE SEMICONDUCTOR MEMORY DEVICE HAVING ISOLATION REGIONS

CROSS-REFERENCE TO RELATED APPLICATIONS

This application is based upon and claims the benefit of priority from the prior Japanese Patent Application No. 11-265205, filed Sep. 20, 1999, the entire contents of which are incorporated herein by reference.

BACKGROUND OF THE INVENTION

The present invention relates to a non-volatile semiconductor memory device and a manufacturing method thereof. Further, the present invention relates to the shape of end portions of a gate electrode formed in each of element regions insulated and isolated by embedded isolation regions. The present invention is applicable to a non-volatile semiconductor memory device of a batch-erasure type such as a NOR-type flash EEPROM or the like, and a memory-mounting logic integrated circuit.

In a semiconductor memory device having element regions insulated and isolated by embedded isolation regions, e.g., in a flash EEPROM, the film thickness of the gate oxide film in MOS transistors formed in a cell array region and that of MOS transistors formed in a peripheral transistor region are different from each other in order to optimize respectively performances of the MOS transistors formed in those regions.

In manufacture of a semiconductor memory device having element regions which are insulated and isolated by embedded isolation regions as described above, gate oxide films having different film thicknesses are formed. For example, gate oxide films of two different film thicknesses are formed. In this case, generally, a substrate is firstly-oxidized over its entire surface thereby to form a gate oxide film having a first film thickness, and the first gate oxide film is next remove partially in the region where a gate oxide film having a second film thickness is formed. Further, masking is carried out so that oxidation seeds might not be provided in the region where the first gate oxide film should remain formed. Thereafter, the second gate oxide film is formed.

In consideration of the relationship with a step of forming an isolation region, there may be various methods for forming gate oxide films having different film thicknesses as described above. For example, a flash EEPROM adopts a method in which a part of gate oxide films is formed before the step of forming isolation regions, and the other part of the gate oxide films is formed after the step of forming the isolation regions forming step.

Meanwhile, in a non-volatile semiconductor memory device having a two-layer gate structure (stacked gate) including a control gate and a floating gate, as represented by a flash EEPROM, there is a case that isolation is achieved by Shallow Trench Isolation (STI). If the floating gate falls into the isolation region at an edge of an active area which contacts with a STI region, electric field concentration on this edge causes variants of the memory cell characteristics and particularly variants of the tunnel current amount used for writing and erasure.

To reduce the variants of the tunnel current amount, a method has been taken in which a STI region is formed so that floating gates and element regions are formed with the positions of their end portions self-aligned with each other, after a tunnel oxide film for memory cells and a polysilicon film for floating gates are formed.

Also, the following method is adopted to maintain a sufficient capacitive coupling between a control gate and a floating gate. That is, the floating gate is formed of first and second polysilicon films. The second polysilicon film is formed on the first polysilicon film so that the second polysilicon film is directly connected with the first polysilicon film. Further, the second polysilicon film is extended over the STI regions.

These techniques are disclosed in, for example, K. Shimizu et al., "A Novel High-Density $5F^2$ NAND STI Cell Technology Suitable for 256 Mbit and 1 Gbit Flash Memories" international ELECTRON DEVICES meeting 1997, WASHINGTON, D.C. Dec. 7–10, 1997, IEDM Technical Digest Paper pp 271–274.

Next, explanation will be made of steps of manufacturing the non-volatile memory, disclosed in the above reference.

This method is adopted to a case of a flash memory having a memory cell part and a peripheral circuit part. FIGS. 1A to 1D shows steps of manufacturing the memory cell part, and FIGS. 2A and 2B shows steps of manufacturing the peripheral circuit part.

Note that the memory cell part has an array of stacked-gate-type cell transistors each having a control gate and a floating gate. In the stacked-gate-type cell transistor, the floating gate is comprised of two polysilicon films, and trenches for isolation are formed to be self-aligned with a polysilicon film as a first layer. A polysilicon film as a second layer is formed above the polysilicon film as the first layer.

At first, as shown in FIG. 1A, a tunnel oxide film (a tunnel oxide film for memory cells) 32 having a film thickness of 10 nm is formed on a silicon substrate 31. A first polysilicon film 33 to form part of floating gates is formed on the tunnel oxide film. Next, as shown in FIG. 1B, a first polysilicon film 33, a tunnel oxide film 32, and a silicon substrate 31 are etched with use of a predetermined etching mask, thereby forming a plurality of grooves 34 in the silicon substrate 31. These grooves 34 form STI for isolation. Also, the silicon substrate 31 is separated into a plurality of element regions.

Next, as shown in FIG. 1C, the grooves 34 are filled with an insulating film 35 for isolation. Further, a second polysilicon film 36 to form part of the floating gates is formed. Subsequently, a control gate 38 is formed with a gate insulating film 37 inserted thereunder, as shown in FIG. 1D.

Meanwhile, with respect to the peripheral circuit part, the memory cell part is covered and protected by a photoresist not shown, in a stage in which the first and second polysilicon films 33 and 36 are formed, as shown in FIG. 2A. Further, as shown in FIG. 2B, the second polysilicon film 36 and the first polysilicon film 33 are removed from the peripheral circuit part. Further, the tunnel oxide film 32 is removed therefrom. Thereafter, a polysilicon film for gate oxidation and gate electrodes is deposited again, thereby to form a gate oxide film 37 and gate electrodes 38 are formed.

At this time, if the gate electrodes 38 are formed to fall in the STI regions at edges of element regions, parasitic transistors are created among MOS transistors.

FIG. 3 is a cross-sectional view in which an edge part 3 of an element region surrounded by a circle mark in FIG. 2B is picked up and enlarged.

If the gate electrode 38 falls into the STI region a t edges of an element region, a parasitic transistor appears in the region B surrounded by a circle mark in the figure. If the parasitic transistor operates, a kink occurs in the subthreshold characteristic, thereby involving increase of the stand-by current. In particular, if the corner parts of the element region are not rounded, the field-effect concentration effect is increased so that the kink characteristic is emphasized.

To prevent this, it is advantageous to carry out a so-called rounding oxidation step of rounding the corner parts of the edge part A of the element region and of creating birds-beaks in the tunnel oxide film 32, before STI regions are filled with the insulating film 35 during formation of STI, as shown in FIG. 4. By optimizing the thickness of the oxide film in the rounding oxidation step, the extent to which the gate electrodes fall in the STI region can be restricted, for example, as shown in FIG. 5.

The rounding oxidation step descried above has been proposed in the U.S. patent Ser. No. 09/527,870 "Semiconductor Device and manufacturing Method Thereof". By the technique e proposed therein, it is possible to restrict the leakage current and the current consumption within a region where the gate voltage of the peripheral circuit transistors is low in a flash EEPROM which adopts the STI isolation structure. Accordingly, the subthreshold current characteristic is rendered sequential in relation to the gate voltage, and the operation is stabled in the region where the gate voltage is low, so that the yield of products can be improved.

However, even in the method for manufacturing a semiconductor device according to the above proposal, the gate electrode 38 has a shape slightly caved into a part where the insulating film 35 isolation is etched, in the step of removing the tunnel oxide film 32 in the peripheral transistor region.

Thus, if the gate electrodes of MOS transistors fall in the side of the STI regions at edge portions of isolation regions in the peripheral transistor region, the electric field is concentrated on the edge portions of isolation regions. Consequently, the threshold voltage of the MOS transistors is lowered, and the subthreshold characteristic causes a kink, resulting in the problem of increase of the current consumption.

Meanwhile, a problem may be caused in the memory cell part if the rounding oxidation step described above is carried out in manufacture of a non-volatile semiconductor memory device including an array of memory cell transistors as follows. That is, in this area, floating gates of stacked-gate-type memory cell transistors are each comprised of two layers of polysilicon films, wherein trenches for isolation are formed to be self-aligned with a polysilicon film as the first layer, and a polysilicon film as the second layer is formed above the polysilicon film as the first layer.

Specifically, the first polysilicon film 33 shown in FIG. 1D is oxidized during the rounding oxidation, so the shape of this film is rounded and an oxide film 39 is further formed above the first polysilicon film 33. This state is shown in FIG. 6 and FIG. 7 which enlarges the region 7 surrounded by a circle mark in FIG. 6.

If an oxide film 39 is formed above the rounded parts of the first polysilicon film 33 by carrying out the rounding oxidation step as described above, it is necessary to remove a constant amount of the oxide film from the upper part and side surfaces of the first polysilicon film 33, before forming the second polysilicon film 36. Otherwise, the oxide film 39 existing above the rounded parts of the first polysilicon film 33 may function as a mask when vertical etching is performed on the stacked gates of the memory cells in a later step. Consequently, the first polysilicon film 33 may remain like a filament, so the floating gates (made of the first polysilicon film 33) may be short-circuited between adjacent memory cells.

In FIG. 7, the part 33B of the side surface of the first polysilicon film 33 indicates the portion where an etching residue appears when vertical etching is carried out. The parts where the etching residues appear may continue to each other between a plurality of adjacent memory cells in the depth direction in the figure. As a result, short-circuiting is caused between the floating gates described above.

BRIEF SUMMARY OF THE INVENTION

The present invention therefore has an object of providing a non-volatile semiconductor memory device and a manufacturing method thereof, which are capable of restricting increase of the current consumption by minimizing falls of gate electrodes of peripheral circuit transistors formed after forming an embedded isolation film, into isolation grooves at end portions of isolation regions.

According to the present invention, there is provided a non-volatile semiconductor memory device comprising: a semiconductor substrate; a plurality of embedded isolation regions each having a groove formed on a surface of the semiconductor substrate, and constructed in a structure that the grooves are internally filled with an insulating film; a plurality of element regions formed by separating the semiconductor substrate by the plurality of embedded isolation regions; a plurality of memory cell transistors respectively formed in a part of the plurality of element regions; and a plurality of peripheral circuit transistors respectively formed in another part of the plurality of element regions, each of the peripheral circuit transistors having a gate insulating film and a gate electrode formed on the gate insulating film, and the gate electrodes being formed to be positioned above an uppermost portion of the grooves of the embedded isolation regions.

Further, according to the present invention, there is provided a non-volatile semiconductor memory device comprising: a semiconductor substrate; a plurality of embedded isolation regions each having a groove formed on a surface of the semiconductor substrate, and constructed in a structure that the grooves are internally filled with an insulating film; a plurality of element regions formed by separating the semiconductor substrate by the plurality of embedded isolation regions; a plurality of memory cell transistors respectively formed in a part of the plurality of element regions, each of the memory cell transistors including a first gate insulating film formed on the semiconductor substrate, a floating gate electrode formed of first and second conductive films layered on the first gate insulating film, a second gate insulating film formed on the floating gate electrode, and a control gate electrode made of a third conductive film formed on the second gate insulating film; and a plurality of peripheral circuit transistors respectively formed in another part of the plurality of element regions, each of the peripheral circuit transistors including a third gate insulating film formed on the semiconductor substrate, and a gate electrode formed on the third gate insulating film, wherein the second conductive films at interfaces of the embedded isolation regions to the grooves are formed to be positioned below an uppermost portion of the grooves, and the gate electrodes are formed to be positioned above the grooves of the embedded isolation regions.

Also, according to the present invention, there is provided a method for manufacturing a non-volatile semiconductor memory device, comprising: a step of forming a layered film including a first gate insulating film, a first polysilicon film, a first silicon nitride film, and a first silicon oxide film layered sequentially on a silicon semiconductor substrate; a step of making the layered film remain in a predetermined pattern shape; a step of forming a plurality of isolation grooves by sequentially removing the first polysilicon film, the first gate insulating film, and the silicon semiconductor substrate, with the layered film used as a mask, thereby to form a plurality of element regions on the silicon semiconductor substrate; a step of forming a first photoresist so as to cover a cell array region of the silicon semiconductor substrate; a first pull-back processing step of pulling back side surfaces of the first polysilicon film in peripheral circuit transistor region, inwards by a predetermined amount from side surfaces of the isolation groove of the silicon semiconductor substrate, by isotropic etching; a step of removing the first photoresist; a second pull-back processing step of processing an entire surface by isotropic etching, thereby to pull back side surfaces of each of the first silicon nitride film inwards by a predetermined amount from the side surfaces of the isolation grooves of the silicon semiconductor substrate; an oxidation step of performing oxidation thereby to round upper corner portions of each of the element regions and to form an oxide film on exposed surfaces of the silicon semiconductor substrate and the first polysilicon film; a step of depositing an isolation insulating film on an entire surface including insides of the isolation grooves; a flattening step of performing polishing thereby to remove the isolation insulating film, the first silicon oxide film, and the first silicon nitride film such that the first silicon nitride film partially remains; a step of removing the first silicon nitride film remaining after the polishing; a step of forming a second photoresist so as to cover the peripheral circuit transistor region; a step of removing the isolation insulating film on the first polysilicon film, by isotropic etching; a step of removing the second photoresist; a step of forming a second polysilicon film on an entire surface; a step of patterning the second polysilicon film thereby to separate the second polysilicon film for respective pieces of the first polysilicon film on the cell array region; a step of forming a second gate-insulating film on an entire surface; a step of removing the second gate insulating film, the second polysilicon film, the first polysilicon-film and the first gate insulating film thereunder on the peripheral circuit transistor region; a step of forming a third gate insulating film on each of the element regions in the peripheral circuit transistor region; and a step of forming a third polysilicon film on an entire surface.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

In the following, a detailed description will be made of an embodiment in which the present invention is applied to a NOR-type flash EEPROM.

The NOR-type flash EEPROM has a gate insulating film (tunnel oxide film) for memory cell transistors, a cell-array region where embedded isolation regions are formed after gate electrodes are formed, a gate insulating film for peripheral-circuit transistors, which is formed after the embedded isolation regions are formed, and a peripheral transistor region where gate electrodes are formed.

Figure 1A:
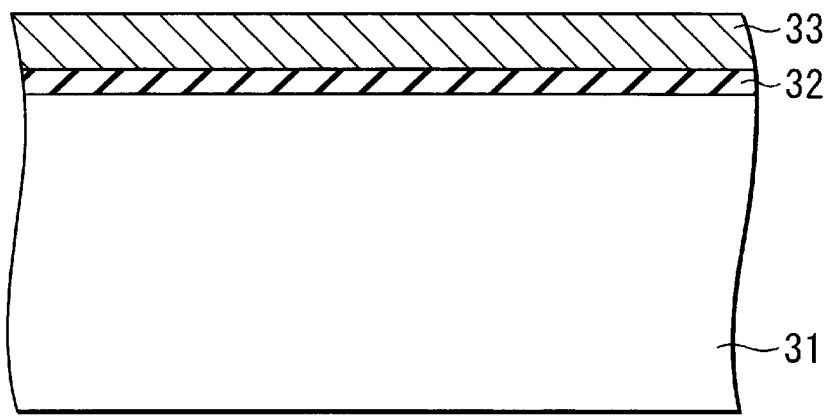
FIGS. 1A to 1D are cross-sectional views showing a part of steps of manufacturing a memory part of a flash EEPROM using conventional embedded isolation structure.
Figure 1B:
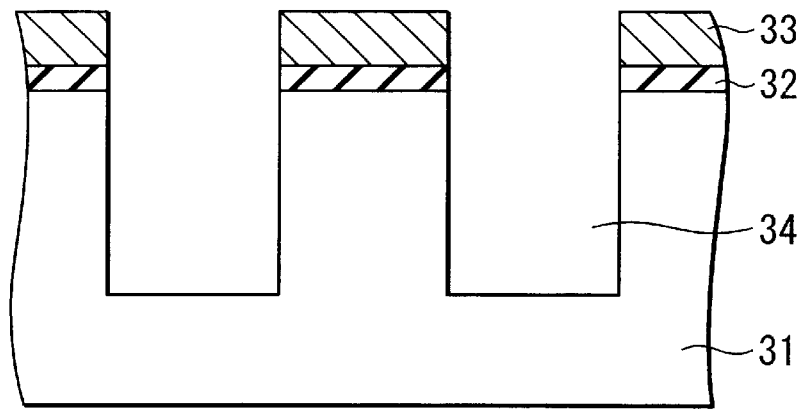
Figure 1C:
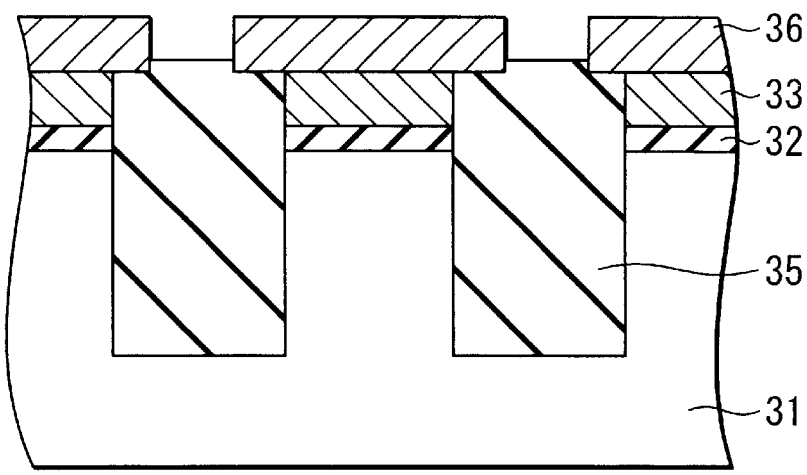
Figure 1D:
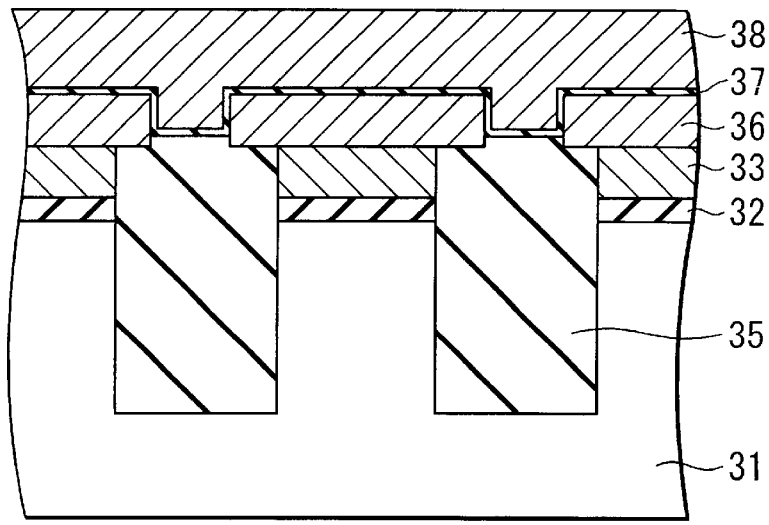
Figure 2A:
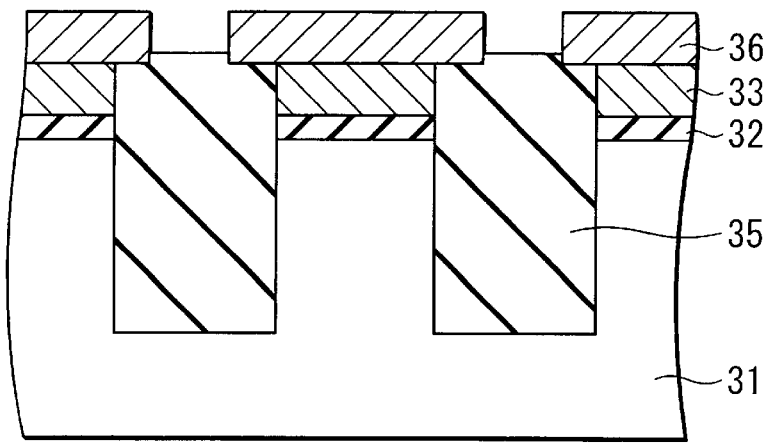
FIGS. 2A and 2B are cross-sectional views showing steps of manufacturing a peripheral circuit part of a flash EEPROM using the conventional embedded isolation structure.
Figure 2B:
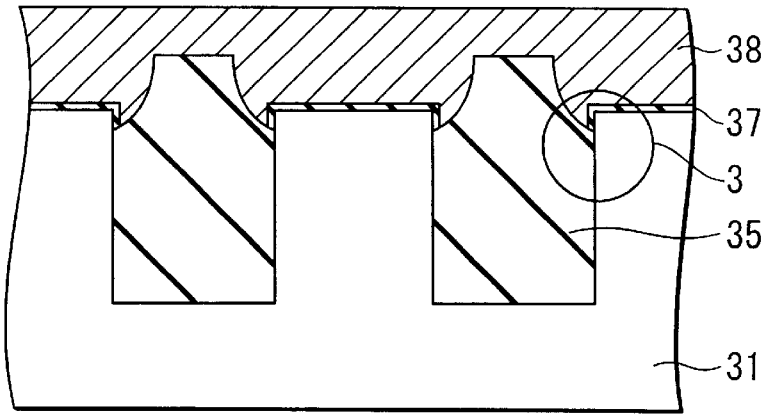
Figure 3:
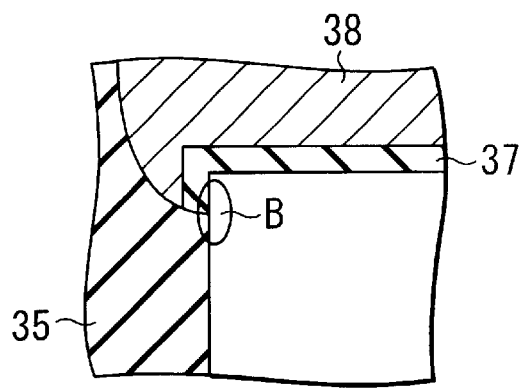
FIG. 3 is an enlarged cross-sectional view showing an edge part 3 of the element region extracted from FIG. 2B.
Figure 4:
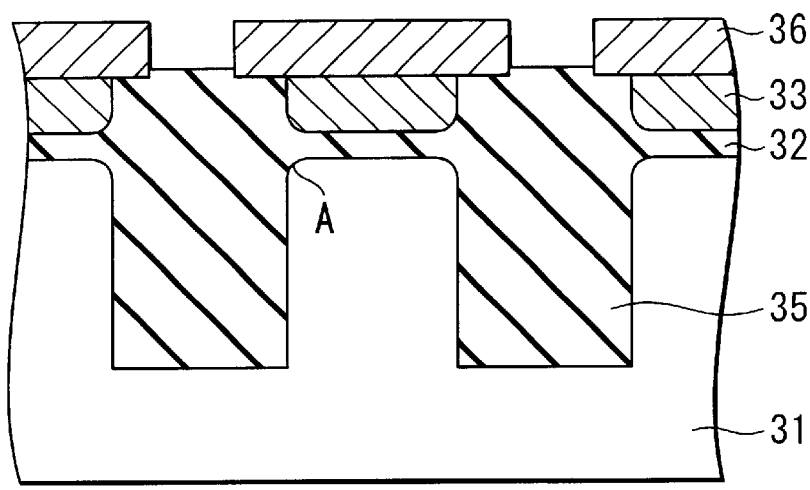
FIG. 4 is a cross-sectional view showing a step of manufacturing a memory cell part, according to another conventional method.
Figure 5:
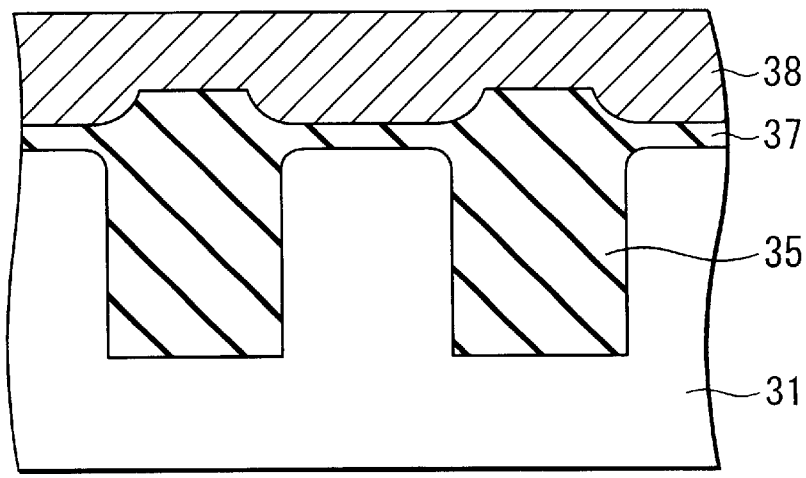
FIG. 5 is a cross-sectional view showing a step of manufacturing a peripheral circuit part, according to the conventional method.
Figure 6:
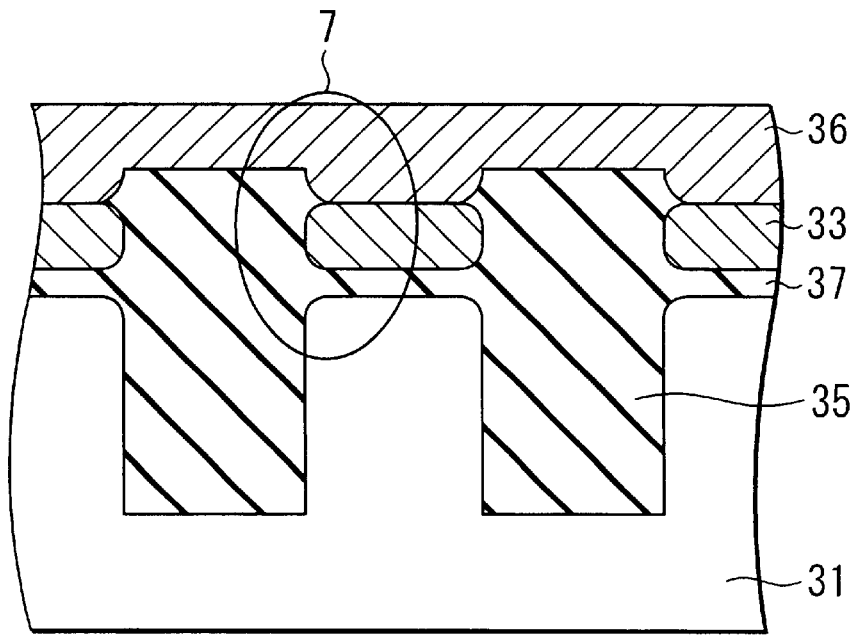
FIG. 6 is a cross-sectional view for explaining a problem of the conventional method.
Figure 7:
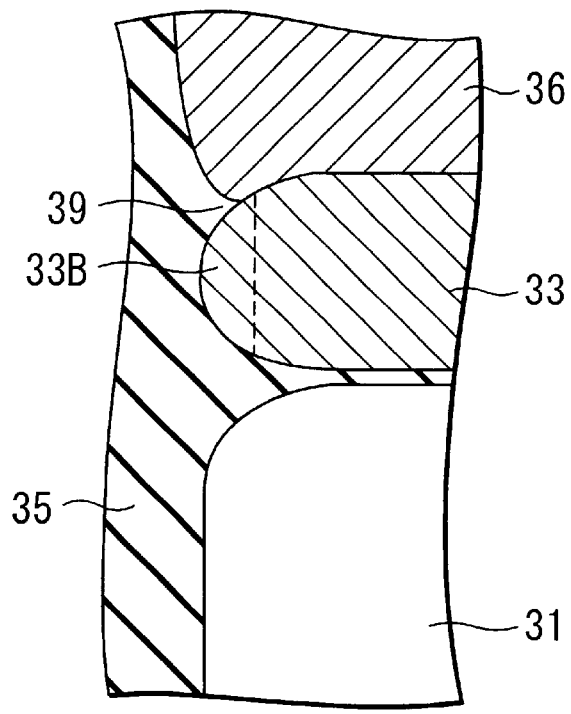
FIG. 7 is an enlarged cross-sectional view showing a region 7 extracted from FIG. 6.
Figure 8A:
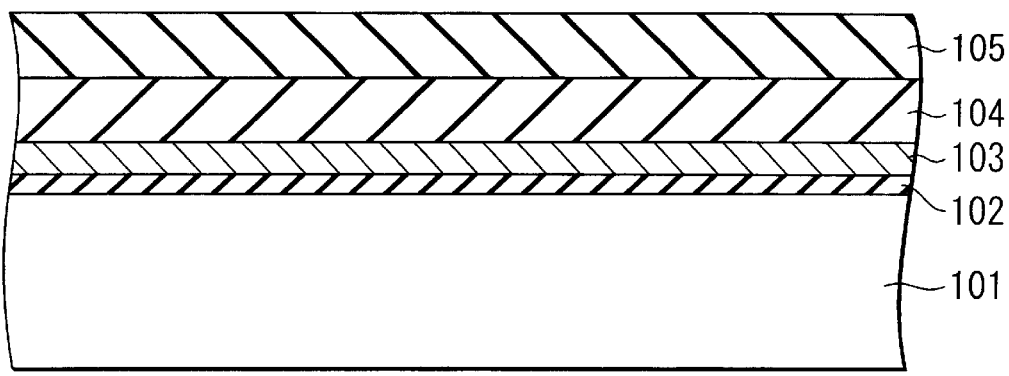
FIGS. 8A to 8P are cross-sectional views showing steps of manufacturing a NOR-type flash EEPROM according to an embodiment of the present invention.

At first, as shown in FIG. 8A, impurities of a predetermined kind are introduced into predetermined regions so that the transistors to be formed will respectively have predetermined threshold values. Next, a gate insulating film (silicon oxide film) 102 for memory cell transistors is formed. Thereafter, a polysilicon film 103 to which phosphorus is introduced as impurities is formed by a Chemical Vapor Deposition (CVD) method.

Next, a first silicon nitride film 104 and a first silicon oxide film 105 are each formed by the CVD method, thereby to form a layered film (first layered film) in which the first silicon nitride film 104 and the first silicon oxide film 105 are layered.

Next, an element region pattern is transferred to the first layered film (105 and 104) by means of a photolithography technique. That is, a photoresist (not shown) is coated, and the element region pattern is transferred to the photoresist. Element regions are masked by the photoresist, and the photoresist is opened on the isolation regions.

Figure 8B:
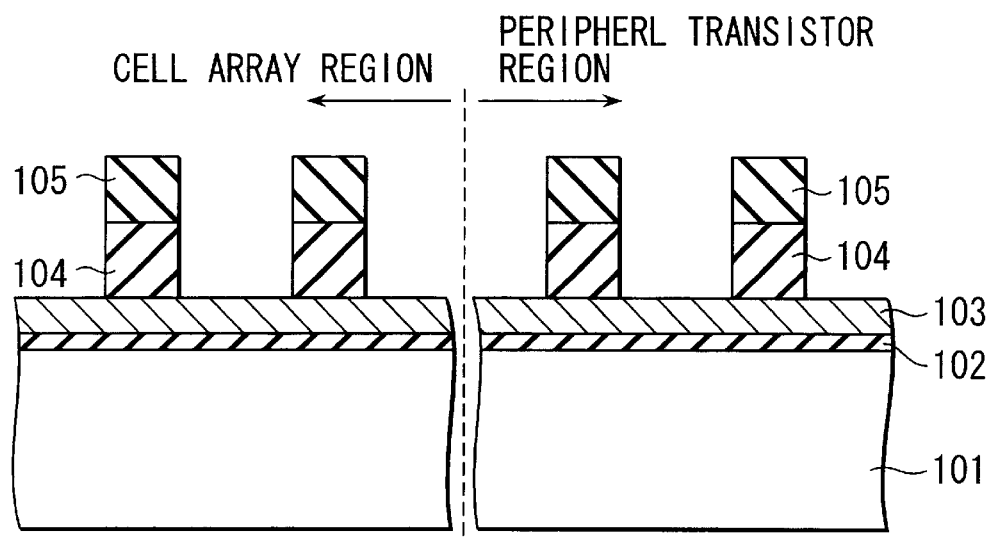

Further, anisotropic etching is performed by Reactive Ion Etching (RIE) with the photoresist used as a mask, so that the element region pattern is transferred to the silicon oxide film 105 and the silicon nitride film 104, as shown in FIG. 8B. Thereafter, the photoresist is removed.

Figure 8C:
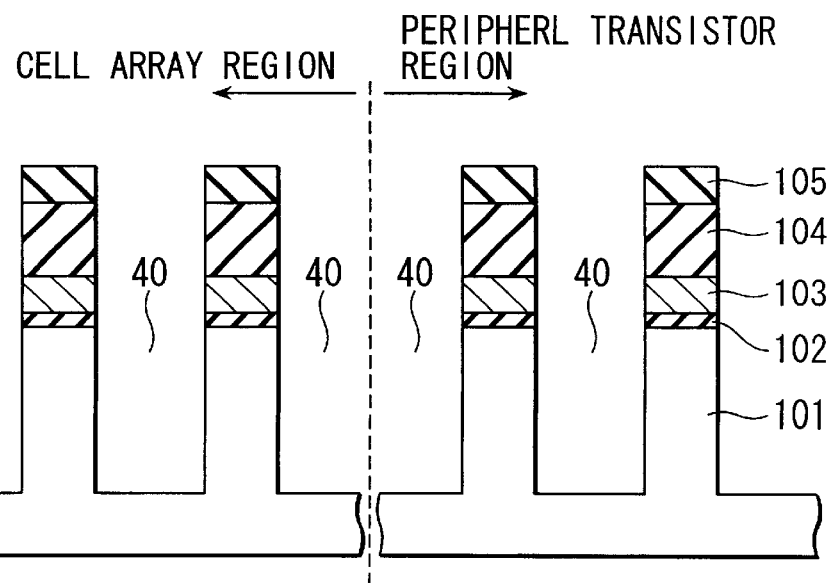

Next, as shown in FIG. 8C, anisotropic etching is performed by the RIE in which the layered film comprised of the silicon nitride film 104 and the silicon oxide film 105, to which the element region pattern has been transferred, is used as a mask. As a result, those parts of the polysilicon film 103, the gate insulating film 102, and the semiconductor substrate 101 that will form isolation regions are removed so a plurality of shallow grooves 40 are formed in the silicon substrate 101.

Figure 8D:
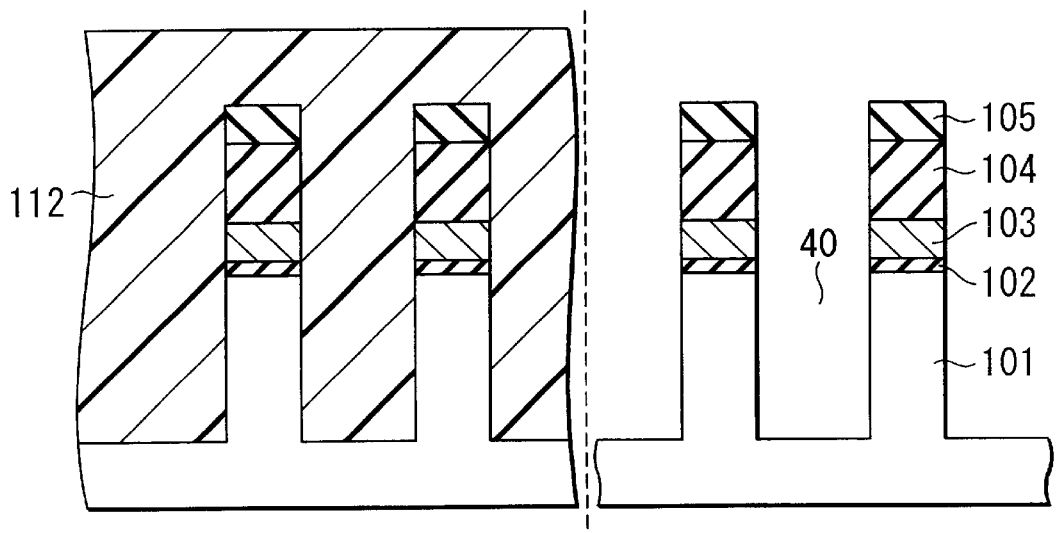

Next, as shown in FIG. 8D, a cell array region pattern is transferred to the photoresist 112 by means of a photolithography technique, so the cell array region is covered with the photoresist 112 while the photoresist is open at the peripheral transistor region.

Figure 8E:
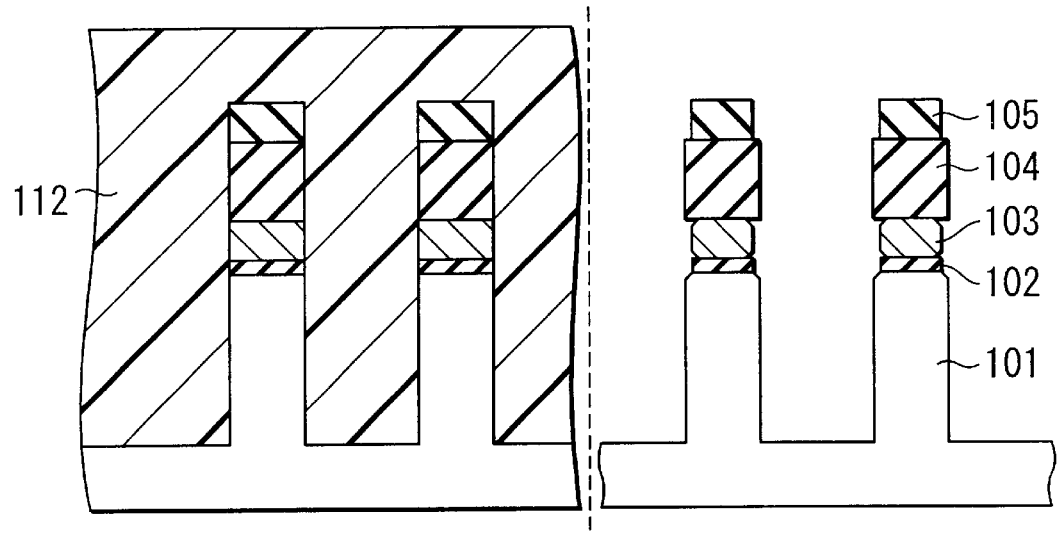

Next, as shown in FIG. 8E, isotropic etching is carried out, i.e., processing (hereinafter called HF/O$_3$ processing) using a processing liquid in which O$_3$ is added to a diluted HF liquid is carried out. In this processing, the silicon substrate 101 and the polysilicon film 103 are oxidized by O$_3$ while they are etched by the diluted HF liquid. As a result, their corner parts are rounded.

In the HF/O$_3$ processing, the etching rates of silicon differ such that the polysilicon film 103 is more etched than the silicon substrate 101. Therefore, the end portions of the polysilicon film 103 are positioned inside the end portions of the element region. Thus, etch-back processing or so-called pull-back processing is carried out.

At this time, the HF/O$_3$ processing is carried out such that the distance from the end of the element region to the end portion of the polysilicon film 103 after a later oxidation step is equivalent to or more than the etching amount of the oxide film in the wet etching step of wet-etching the gate insulating film in the peripheral transistor region to be executed later.

In other words, in the etch-back processing step described above, the processing of etching-back the side surfaces of the polysilicon film 103 is carried out such that the positional difference between the interface between an oxide film to be formed on the side surfaces of the polysilicon film 103 in a later oxidation step and the polysilicon film 103 and the interface between an oxidation film formed on the side surfaces of each isolation groove of the silicon substrate 101 and the side surfaces of the isolation groove of the silicon substrate 101 is equivalent to or more than the etching amount of the oxide film in a later removal step of removing a gate insulating film.

Thereafter, the photoresist 112 is removed.

Figure 8F:
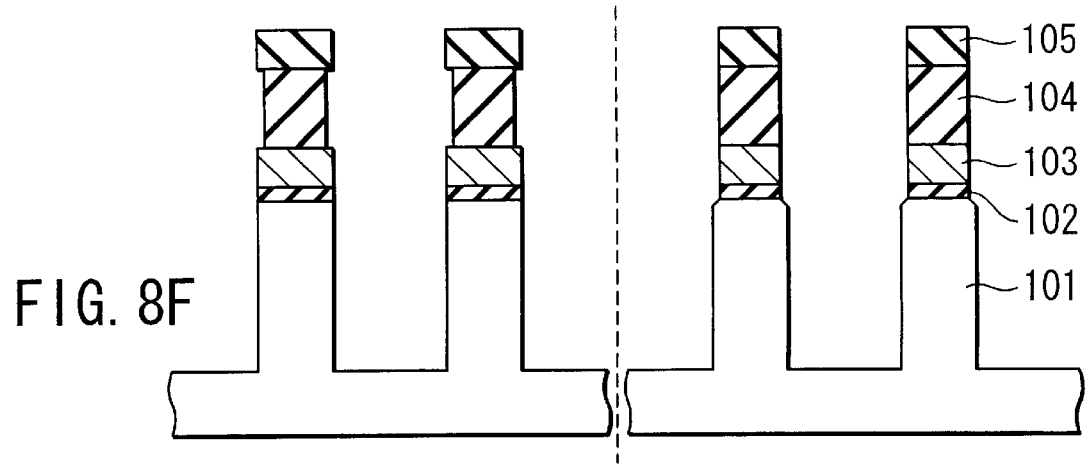

Next, as shown in FIG. 8F, the silicon nitride film 104 is etched by wet etching. If thermal phosphoric acid is used in this etching, the etching speed of the silicon nitride film 104 is so fast that control thereof is difficult. Therefore, this wet etching (hereinafter called HF/Glycerol processing) is carried out by using a processing liquid in which Glycerol is applied to a diluted HF liquid. At this time, the etching amount of the silicon nitride film 104 is arranged such that the end portions of the silicon nitride film 104 are positioned inside the end portions of the polysilicon film 103 which will be formed after a later oxidation step performed thereon. In this manner, the silicon nitride film 104 is pulled back from both ends of the element region of the silicon substrate 101.

If the silicon nitride film 104 is pulled back from the ends of the element region of the silicon substrate 101, the silicon nitride film 104 remains like eaves over the polysilicon film 103 after an insulating film for isolation is formed in a later step. As a result of this, a problem arises in that the isolation insulating film is not sufficiently formed on the side surfaces of the polysilicon film 103 under the silicon nitride film 104, due to a relationship with the coating property of the isolation insulating film.

Figure 8G:
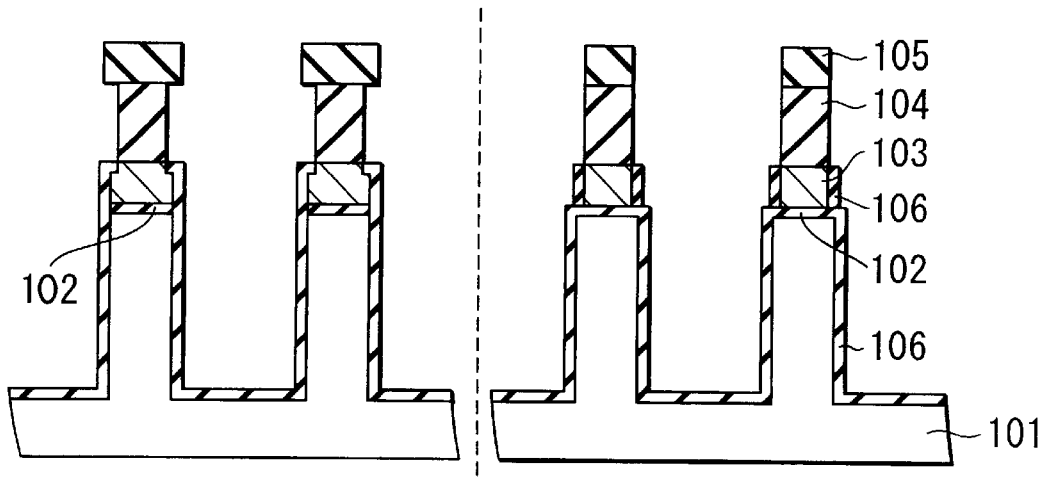

Next, oxidation is carried out, for example, at a temperature of 900 to 1000° C. at an oxygen density of 10%. As shown in FIG. 8G, the exposed surfaces of the grooves of the silicon substrate 101 and the exposed surfaces of the polysilicon film 103 are oxidized so that a silicon oxide film 106 is formed. At this time, in the peripheral transistor region, an oxidation agent is supplied to the parts between the end portions of each element region of the silicon substrate 101 and the polysilicon film 103 above the end portions, so that oxidation proceeds. As a result of this, bird's-beaks are formed and each end portion of the element regions has a rounded shape.

At this time, the silicon oxide film 106 formed on the side surfaces of the polysilicon film 103 is positioned inside the ends of the element region of the silicon substrate 101. The distance from each of the ends to the silicon oxide film 106 is optimized by the HF/O$_3$ processing described above.

Figure 8H:
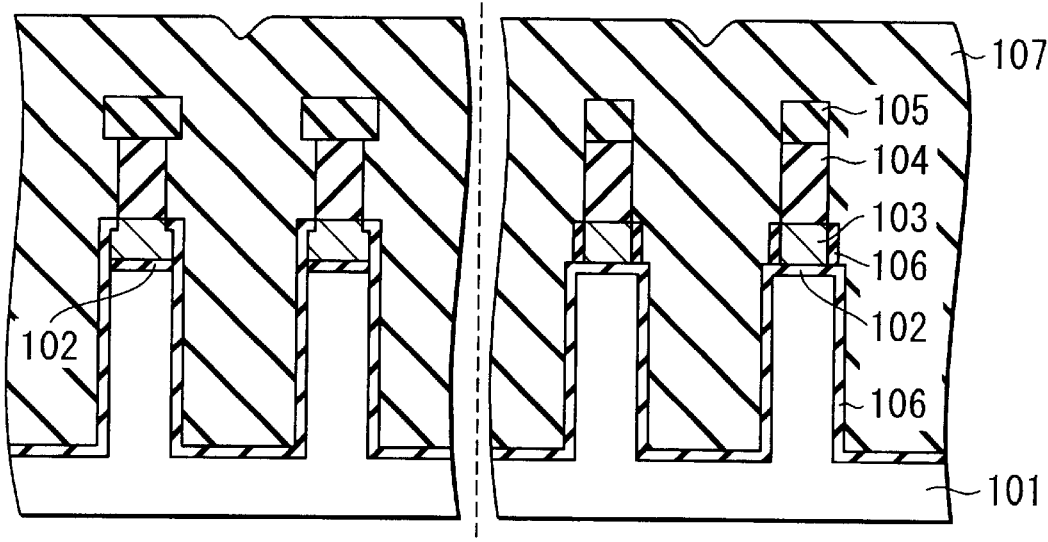

Next, as shown in FIG. 8H, an insulating film 107 for isolation made of, for example, LP-TEOS (Low Pressure Tetra-Ethyl-Oxide-Silicon or Low Pressure Tetra-Ethyl ortho silicate) is deposited by a CVD method, so that the insulating film 107 is formed on the entire surface including the insides of the grooves 40.

Figure 8I:
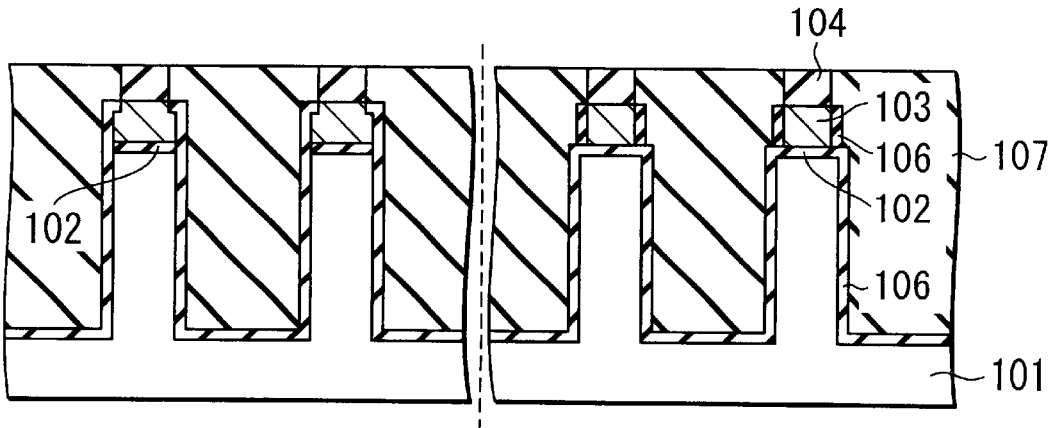

Next, as shown in FIG. 8I, the insulating film 107 is polished by Chemical Mechanical Polish (CMP), so flattening processing is carried out. The polishing is performed so as to stop in the middle of the silicon nitride film 104 above the element region.

Figure 8J:
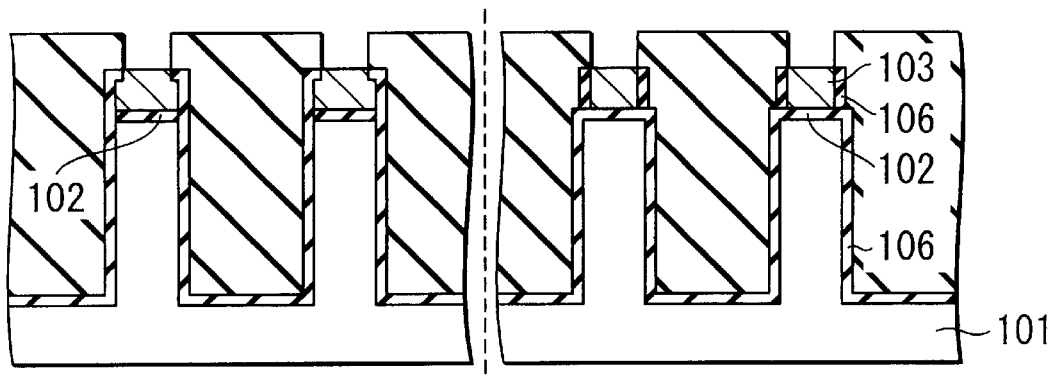

Next, as shown in FIG. 8J, the silicon nitride film 104 is removed by thermal phosphorus acid, thereby forming isolation regions.

Figure 8K:
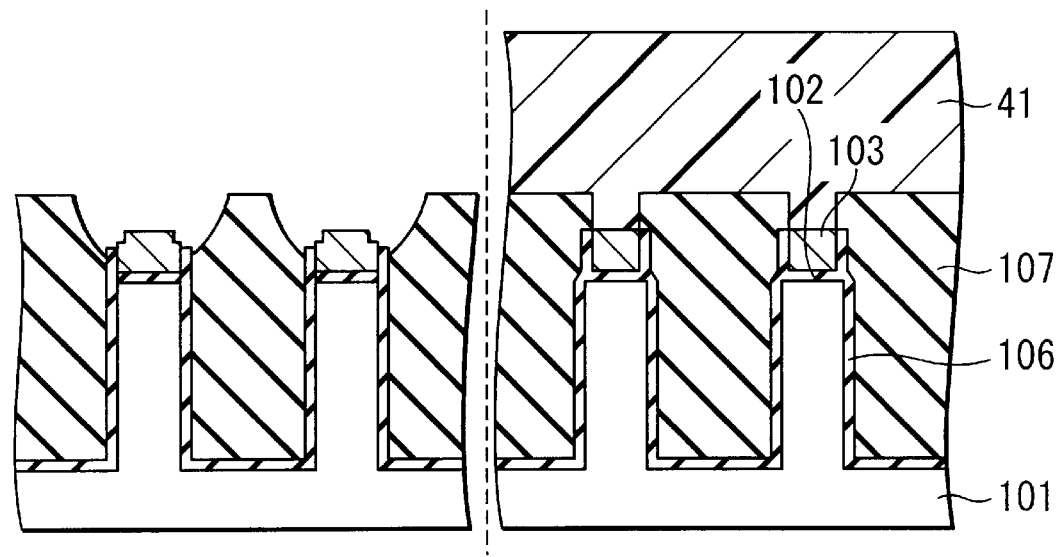

Next, as shown in FIG. 8K, a peripheral transistor region pattern is transferred to a photoresist with use of a photolithography technique, so the peripheral transistor region is covered with a photoresist 41 while the photoresist is open above the cell array region.

Further, isotropic etching such as wet etching using NH$_4$F or the like is performed to remove the eaves-like insulating film 107 for isolation above the polysilicon film 103 in the cell array region. Thereafter, the photoresist 41 is removed.

If a polysilicon film 108 described later is additionally layered in a next step without removing the eaves-like insulating film 107, the eaves-like insulating film 107 remains and serves as a mask material when finally forming the gates in the cell array region. As a result, the polysilicon film 103 under the eaves-like insulating film 107 also remains so that the floating gates are short-circuited between memory cells, as has been described previously.

Figure 8L:
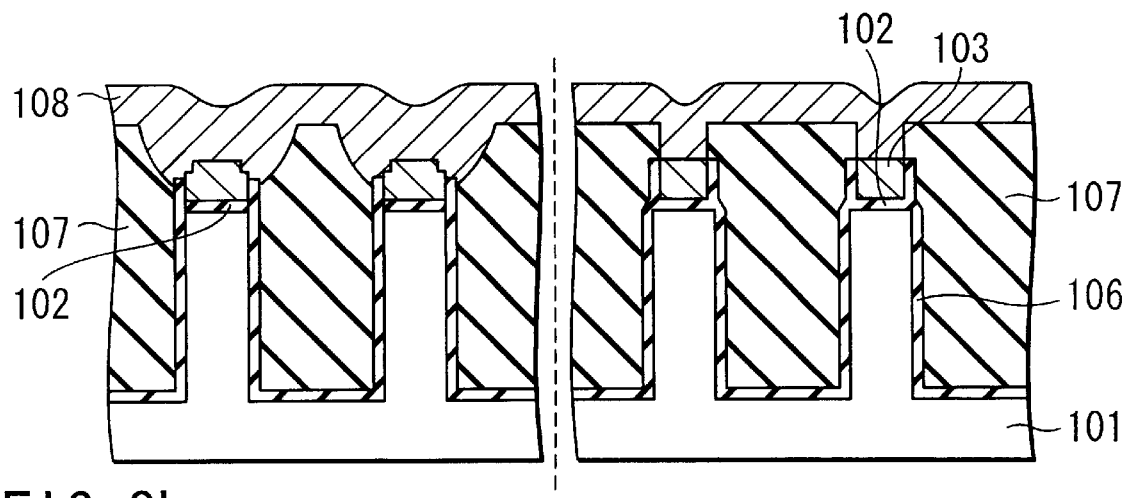

Next, as shown in FIG. 8L, a polysilicon film 108 for floating gates, to which phosphorus is introduced as impurities, is deposited to have a predetermined film thickness on the entire surface.

Figure 8M:
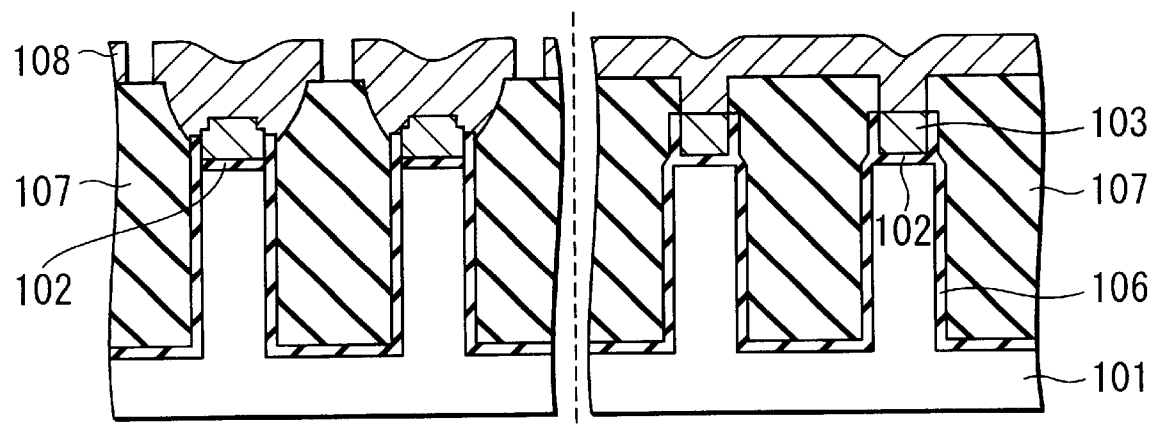

Next, to separate the polysilicon film 108 for floating gates into pieces for respective cell transistors, a slit region pattern is transferred to a photoresist not shown but existing on the isolation insulating film. With this pattern used as a mask, anisotropic etching is carried out by the RIE. In this manner, as shown in FIG. 8M, slits are formed in the polysilicon film 108 in the cell array region above the isolation insulating film, so the polysilicon film 108 is separated into pieces for respective transistors. At this time, to maintain a sufficient capacitive coupling between the control gate and floating gate of each cell transistor, each separated piece of the polysilicon film 108 is arranged to project over the isolation regions. Thereafter, the photoresist is removed.

Figure 8N:
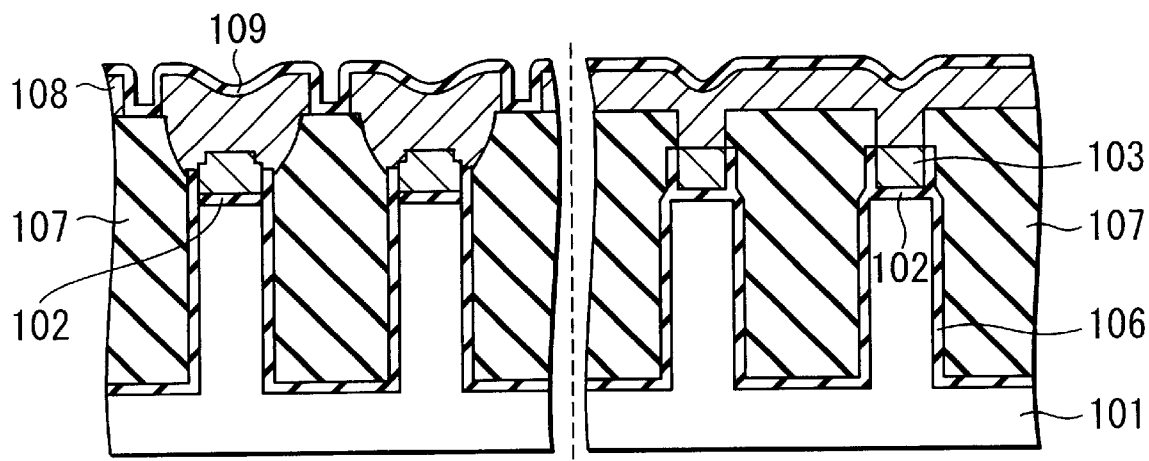

Next, as shown in FIG. 8N, an ONO film 109 in which a silicon oxide film, a silicon nitride film, and a silicon oxide film are layered is formed on the entire surface.

Figure 8O:
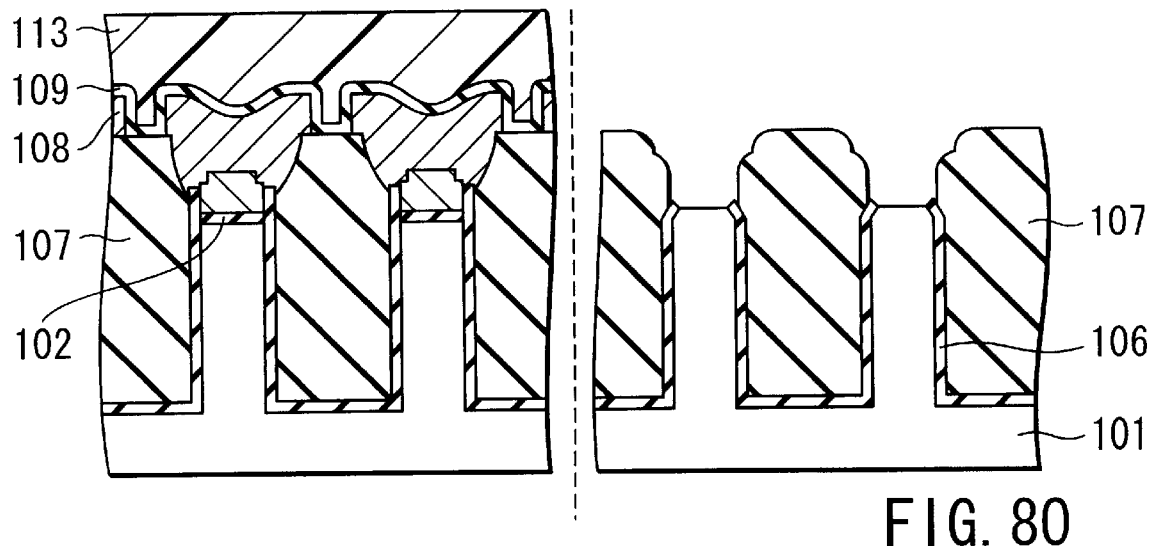

Next, as shown in FIG. 8O, with use of the photolithography technique, the cell array region is covered with a photoresist 113 while the photoresist is open above the peripheral transistor region. Further, anisotropic etching is carried out by the RIE, so that the ONO film 109 is removed from the peripheral transistor region. Further, Chemical Dry Etching (CDE) is carried out to remove the polysilicon films 108 and 103 from the peripheral transistor region.

Further, wet etching is carried out with use of $NH_4F$ or the like, to remove the gate insulating film 102 from the peripheral transistor region. At this time, the silicon oxide film 106 and the insulating film 107 for isolation are partially etched. However, expecting the etching amounts of the silicon oxide film 106 and the insulating film 107 in this wet etching step, the silicon oxide film 106 and the insulating film 107 previously formed so as to exist inside the ends of the element region. Therefore, in this wet etching step, the silicon oxide film 106 and the insulating film 107 are pulled back only to the ends of the element region. It is thus possible to avoid the problem that these films fall in the original grooves 40 at the end portions of the silicon substrate.

Figure 8P:
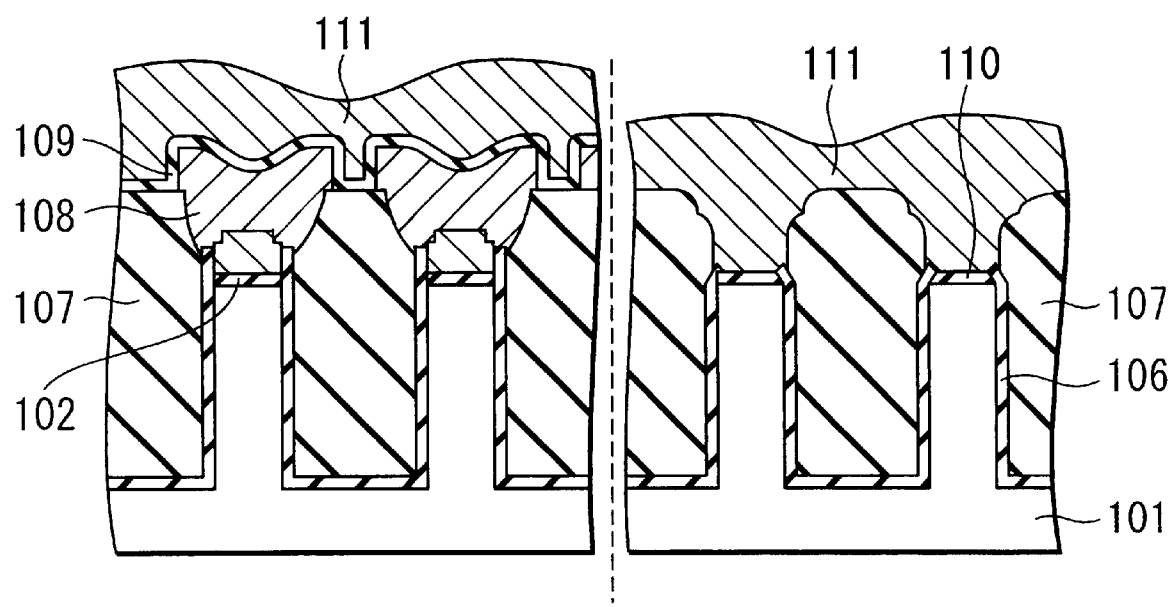

Next, as shown in FIG. 8P, a gate oxide film 110 for peripheral circuit transistors is formed after the photoresist 113 is removed. In this case, as described above, it is possible to avoid the problem that the silicon oxide film 106 and the insulating film 107 fall at the ends of the silicon substrate when the gate insulating film 102 in the peripheral transistor region is etched. Therefore, the formed gate oxide film 110 does not fall in the original grooves 40 at the isolation end portions.

Next, the photoresist 113 is removed from the cell array regions. Thereafter, a polysilicon film 111 to which phosphorus has been introduced as impurities is deposited on the entire surface, to form gate electrodes of transistors in the peripheral-transistor region and control gates in the cell array region.

Next, with use of the photolithography technique, a gate pattern of the cell array region is transferred to a photoresist, and anisotropic etching is carried out by the RIE so that the gate pattern is transferred to the polysilicon film 111, the ONO film 109, and the polysilicon films 108 and 103. Formed thereby are the polysilicon film 111 for control gates of cell transistors, and gate electrodes in which the polysilicon films 108 and 103 for floating gates are layered in two layers.

Next, the photoresist is removed. Thereafter, a gate pattern of the peripheral transistor region is newly transferred to a photoresist with use of the photolithography technique. Anisotropic etching is further carried out by the RIE thereby to transfer the gate pattern of the peripheral circuit transistors is transferred to the polysilicon film 111.

Figure 9:
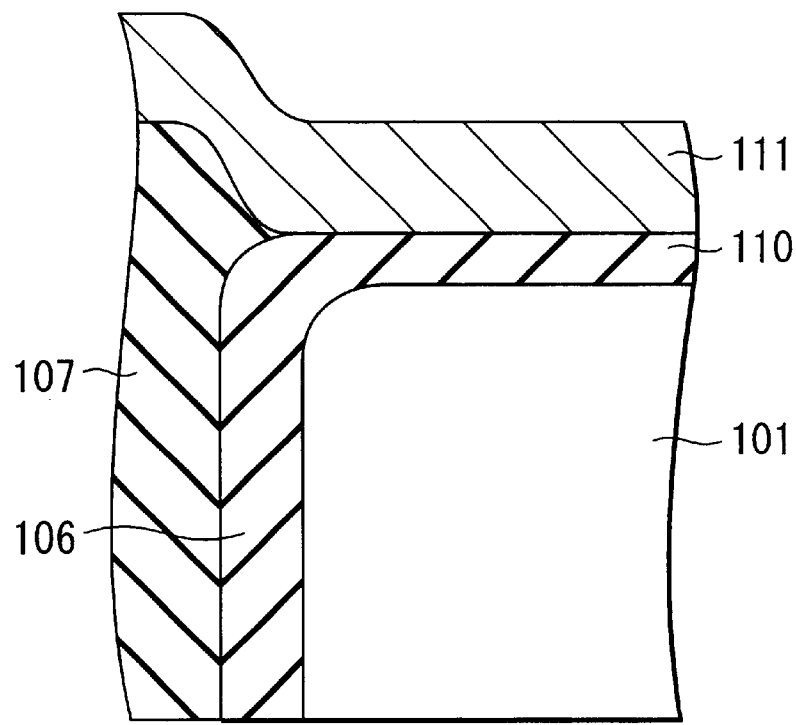
FIG. 9 is an enlarged cross-sectional view showing a gate electrode and its periphery of a peripheral circuit transistor formed in a step subsequent to FIG. 8P.

In this manner, the gate electrodes 111 of the peripheral circuit transistors are formed as shown in FIG. 9.

In this case, as described above, it is possible to avoid the problem that the silicon oxide film 106 and the insulating film 107 fall in the original grooves 40 at the ends of the silicon substrate when etching the gate insulating film 102 in the peripheral transistor region. Therefore, the gate electrodes 111 of the peripheral circuit transistors do not fall in the original grooves at the isolation end portions but are positioned above the uppermost parts of the original grooves 40. In other words, the isolation end portions of the gate electrode 111 of each peripheral circuit transistor are positioned to be horizontal to the center part of the gate electrode. Thereafter, the photoresist 113 is removed.

Next, impurities are introduced to selected positions of the silicon substrate 101 in order to form a diffusion layer for sources and drains (not shown) of transistors in the cell array region and the peripheral transistor region. Further, a Boron doped PhosphoSilicate Glass (BPSG) film or a PhosphorSilicate Glass (PSG) film is coated as an interlayer insulating film (not shown). Further, with use of the photolithography technique, a pattern of contact holes for electrodes is transferred to a photoresist, and anisotropic etching is carried out by the RIE. As a result, contact holes (not shown) are opened in the interlayer insulating film. Thereafter, the photoresist is removed.

Next, an Al wiring film (not shown) is deposited on the entire surface with use of a sputtering method. Thereafter, a wiring pattern is transferred to a photoresist with use of the photolithography technique, and anisotropic etching is carried out by the RIE, thereby to form Al wires. The photoresist is thereafter removed.

Next, a PSG film is deposited as a protection film (not shown) on the Al wires, and further, a silicon nitride film is deposited by Plasma Enhanced Chemical Vapor Deposition (PE-CVD). Further, with use of the photolithography technique, a pattern of bonding pads is transferred to a photoresist, and those parts of the protection film that are positioned above the bonding pads (not shown) are removed by etching. Thereafter, the photoresist is removed. A wafer is thus completed.

That is, in the manufacturing steps described above, the insulating films (oxide films) 106 and 107 for isolation are partially etched when the gate insulating film (tunnel oxide film) 102 formed in a cell transistor step is removed by wet etching before forming the gate insulating film 110 in the peripheral transistor region. However, these insulating film (oxide films) 106 and 107 have been previously formed such that these films are pulled back to the inside from both ends of each element region to an extent approximately equivalent to their etching amounts. Therefore, the insulating films (oxide films) 106 and 107 are pulled back only to the ends of the element region, so it is possible to avoid the problem that the ends of the silicon substrate partially fall.

Therefore, the gate electrodes of peripheral circuit transistors, which are formed after forming an isolation film, are prevented from falling down at isolation end portions. Accordingly, it is possible to avoid the problem that the electric field is concentrated on isolation end portions of channels of the peripheral circuit transistors so that the threshold voltage is lowered. As a result, the leakage current of the peripheral circuit transistors is reduced and the subthreshold current characteristic of the peripheral circuit transistors is improved. Therefore, it is possible to decrease the power consumption in products and to decrease the yield.

Also, in the manufacturing steps described above, etching residues of the first polysilicon film 103 are prevented from being created during processing of stacked gates by anisotropic etching, even if an oxidation step of the first polysilicon film 103 is added when the floating gate of each cell transistor is formed of the first polysilicon film 103 and the second polysilicon film 108 thereon. Therefore, it is possible to prevent floating gates from being short-circuited between memory cells.

Also, the non-volatile semiconductor memory device according to the present invention is not limited to the flash EEPROM in the above embodiment but may be such a non-volatile semiconductor memory device that comprises a cell array region in which element regions of memory cell transistors are insulated and isolated by embedded isolation regions, and a peripheral transistor region in which a plurality of peripheral circuit transistors are formed in a memory cell array and element regions of the peripheral circuit transistors are insulated and isolated by embedded isolation regions.

In this case, the present invention is characterized in that the isolation end portions of the gate electrodes of the peripheral circuit transistors do not fall in grooves 40. In other words, the isolation end portions are positioned to be horizontal to the center part of each gate electrode. In addition, the isolation end portions of the gate electrode part of each memory cell transistor are positioned to be horizontal to the center part of the gate electrode.

Also, the method for manufacturing a non-volatile semiconductor memory device according to the present invention is applicable not only to the flash EEPROM in the above embodiment but also to manufacture of a non-volatile semiconductor memory device in which a part of gate insulating films is formed before an isolation step and the other part of the gate insulating films is formed after the isolation step.

As described above, according to the non-volatile semiconductor memory device of the present invention and the manufacturing method thereof, it is possible to avoid the problem that gate electrodes fall at isolation edge portions of gate electrode parts of peripheral circuit transistors which are formed after formation of an isolation film. Therefore, the leakage current and the current consumption can be reduced in the regions where the gate voltage of the peripheral circuit transistors is low. The subthreshold current characteristic is sequential in relation to the gate voltage, and operations of transistors are stabled in the regions where the gate voltage is low. The yield of products can be improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a non-volatile semiconductor memory device, comprising:

a step of forming a a first gate insulating film, a first polysilicon film, and a layered film layered sequentially on a peripheral circuit transistor region and a cell array region of a silicon semiconductor substrate; wherein the layered film includes a silicon nitride film and a first silicon oxide film layered sequentially;

a step of making the layered film remain in a predetermined pattern shape;

a step of forming a plurality of isolation grooves by sequentially removing the first polysilicon film, the first gate insulating film, and the silicon semiconductor substrate, with the layered film used as a mask, thereby to form a plurality of element regions in the peripheral circuit transistor region and the cell array region of the silicon semiconductor substrate;

a step of forming a first photoresist so as to cover the cell array region of the silicon semiconductor substrate;

a first pull-back processing step of pulling back side surfaces of the first polysilicon film in the peripheral circuit transistor region, inwards by a predetermined amount from side surfaces of the isolation groove of the silicon semiconductor substrate, by isotropic etching;

a step of removing the first photoresist;

a second pull-back processing step of processing an entire surface by isotropic etching, thereby to pull back side surfaces of the first silicon nitride film inwards by a predetermined amount from the side surfaces of the isolation grooves of the silicon semiconductor substrate;

an oxidation step of performing oxidation thereby to round upper corner portions of each of the element regions and to form an oxide film on exposed surfaces of the silicon semiconductor substrate and the first polysilicon film;

a step of depositing an isolation insulating film on an entire surface including insides of the isolation grooves;

a flattening step of performing polishing thereby to remove the isolation insulating film, the first silicon oxide film, and the first silicon nitride film such that the first silicon nitride film partially remains;

a step of removing the first silicon nitride film remaining after the polishing;

a step of forming a second photoresist so as to cover the peripheral circuit transistor region;

a step of removing the isolation insulating film on the first polysilicon film, by isotropic etching;

a step of removing the second photoresist;

a step of forming a second polysilicon film on an entire surface;

a step of patterning the second polysilicon film thereby to separate the second polysilicon film for respective pieces of the first polysilicon film on the cell array region;

a step of forming a second gate insulating film on an entire surface;

a step of removing the second gate insulating film, the second polysilicon film, the first polysilicon film and the first gate insulating film thereunder on the peripheral circuit transistor region;

a step of forming a third gate insulating film on each of the element regions in the peripheral circuit transistor region; and a step of forming a third polysilicon film on an entire surface.

2. The method according to claim 1, wherein the first pull-back processing step is carried out by wet etching.

3. The method according to claim 2, wherein the wet etching is carried out by a HF solution containing $O_3$.

4. The method according to claim 1, wherein the second pull-back processing step is carried out by wet etching.

5. The method according to claim 4, wherein the wet etching is carried out with use of a processing liquid in which Glycerol is added to a diluted HF solution.

6. The method according to claim 1, wherein the processing of pulling back the side surfaces of the first polysilicon film in the first pull-back processing step is carried out such that a positional difference between an interface between the oxide film formed on the side surfaces of the first polysilicon film in the oxidation step and the first polysilicon film and an interface between the oxide film formed on the side surfaces of the isolation grooves of the silicon semiconductor substrate and the side surfaces of the isolation grooves of the silicon semiconductor substrate is equal to or more than an etching amount when the first gate insulating film is removed.

7. The method according to claim 1, wherein in the second pull-back processing step, each of the side surfaces of the first silicon nitride film is pulled back to a position of the oxide film formed on the side surfaces of the first polysilicon film in the oxidation step or is pulled back more inwards than the position.

8. The method according to claim 1, wherein the step of removing the isolation insulating film on the first polysilicon film by the isotropic etching is carried out by wet etching.

9. The method according to claim 1, wherein the step of removing the first silicon nitride film is carried out by use of thermal phosphoric acid.

10. The method according to claim 1, wherein the step of removing the second gate insulating film, the second polysilicon film, the first polysilicon film, and the first gate insulating film includes:

a step of forming a third photoresist so as to cover the cell array region;

a step of removing the second gate insulating film on the peripheral circuit transistor region;

a step of removing the second polysilicon film on the peripheral circuit transistor region and the first polysilicon film thereunder, by isotropic etching;

a step of removing the first gate insulating film in the peripheral circuit transistor region, by isotropic etching; and a step of removing the third photoresist.

* * * * *

UNITED STATES PATENT AND TRADEMARK OFFICE
CERTIFICATE OF CORRECTION

PATENT NO.     : 6,417,047 B1
DATED          : July 9, 2002
INVENTOR(S)    : Isobe It is certified that error appears in the above-identified patent and that said Letters Patent is hereby corrected as shown below:

<u>Column 11,</u>
Line 38, change "forming a a first" to -- forming a first --.

Signed and Sealed this

Eighteenth Day of March, 2003

JAMES E. ROGAN
*Director of the United States Patent and Trademark Office*